;US009117899B2

(12) United States Patent
Harrington, III et al.

(10) Patent No.: US 9,117,899 B2
(45) Date of Patent: Aug. 25, 2015

(54) DEVICE ARCHITECTURE AND METHOD FOR IMPROVED PACKING OF VERTICAL FIELD EFFECT DEVICES

(71) Applicant: D3 Semiconductor LLC, Addison, TX (US)

(72) Inventors: Thomas E. Harrington, III, Carrollton, TX (US); Robert Kuo-Chang Yang, Campbell, CA (US)

(73) Assignee: D3 Semiconductor LLC, Addison, TX (US)

( * ) Notice: Subject to any disclaimer, the term of this patent is extended or adjusted under 35 U.S.C. 154(b) by 28 days.

(21) Appl. No.: 14/091,169

(22) Filed: Nov. 26, 2013

(65) Prior Publication Data

US 2014/0145245 A1     May 29, 2014

Related U.S. Application Data

(60) Provisional application No. 61/729,686, filed on Nov. 26, 2012.

(51) Int. Cl.

| | |
|---|---|
| *H01L 31/0312* | (2006.01) |
| *H01L 29/78* | (2006.01) |
| *H01L 29/04* | (2006.01) |
| *H01L 29/66* | (2006.01) |
| *H01L 29/739* | (2006.01) |
| *H01L 29/06* | (2006.01) |

(52) U.S. Cl.
CPC .......... *H01L 29/7813* (2013.01); *H01L 29/045* (2013.01); *H01L 29/0634* (2013.01); *H01L 29/0696* (2013.01); *H01L 29/66348* (2013.01); *H01L 29/66734* (2013.01); *H01L 29/7397* (2013.01)

(58) Field of Classification Search
CPC ............ H01L 29/0696; H01L 29/8083; H01L 29/66712; H01L 29/66727; H01L 29/66909; H01L 29/7802; H01L 29/66068; H01L 29/1608; H01L 29/2003; H01L 29/41766; H01L 27/0883; H01L 29/0634; H01L 29/0646
USPC ........ 257/66–67, 77, 328–330, 365, 407–409
See application file for complete search history.

(56) References Cited

U.S. PATENT DOCUMENTS

| | | |
|---|---|---|
| 2004/0036121 A1 | 2/2004 | Aoki et al. |
| 2005/0035401 A1 | 2/2005 | Yamaguchi et al. |

(Continued)

FOREIGN PATENT DOCUMENTS

WO     2012149195     11/2012

*Primary Examiner* — Dung Le
(74) *Attorney, Agent, or Firm* — Schultz & Associates, P.C.

(57) ABSTRACT

A semiconductor field-effect device is disclosed that utilizes an octagonal or inverse-octagonal deep trench super-junction in combination with an octagonal or inverse-octagonal gate trench. The field-effect device achieves improved packing density, improved current density, and improved on resistance, while at the same time maintaining compatibility with the multiple-of-45°-angles of native photomask processing and having well characterized (010), (100) and (110) (and their equivalent) silicon sidewall surfaces for selective epitaxial refill and gate oxidation, resulting in improved scalability. By varying the relative length of each sidewall surface, devices with differing threshold voltages can be achieved without additional processing steps. Mixing trenches with varying sidewall lengths also allows for stress balancing during selective epitaxial refill.

14 Claims, 7 Drawing Sheets

(56) References Cited

U.S. PATENT DOCUMENTS

| | | |
|---|---|---|
| 2006/0102953 A1 | 5/2006 | Miura et al. |
| 2007/0108512 A1 | 5/2007 | Sedlmaier et al. |
| 2007/0228496 A1* | 10/2007 | Rochefort et al. ............ 257/409 |
| 2008/0258239 A1 | 10/2008 | Ishiguro et al. |
| 2010/0193800 A1 | 8/2010 | Uchida et al. |
| 2011/0180812 A1 | 7/2011 | Masuda et al. |

* cited by examiner

DEVICE ARCHITECTURE AND METHOD FOR IMPROVED PACKING OF VERTICAL FIELD EFFECT DEVICES

CROSS-REFERENCE TO RELATED APPLICATIONS

This application claims priority benefit from U.S. Provisional Application No. 61/729,686 filed Nov. 26, 2012. The patent application identified above is incorporated here by reference in its entirety to provide continuity of disclosure.

FIELD OF THE INVENTION

The present invention relates generally to the methods and techniques for improving the packing density of vertical semiconductor devices utilizing three-dimensional octagonal and inverse-octagonal structures.

BACKGROUND OF THE INVENTION

For many years, manufacturers and developers of high performance power electronics have sought to improve power-handling density of discrete electronic components.

For power electronics, however, there is a need to achieve improved power density by techniques other than reducing device dimensions. There is a need for innovative device architectures that allow for greater current-per-unit-area, higher voltages, lower on-resistance, and shorter switching time. Such device architectures would provide greater power density resulting in smaller power electronic switching systems, they also would provide for faster and more efficient switching, resulting in reduced energy consumption and reduced heat generation.

SUMMARY OF THE DISCLOSURE

The present invention is a semiconductor device architecture that improves the power density achievable with a vertical power MOSFET device, and provides a method for further scaling of power density.

According to a preferred embodiment, a vertical power field effect device, such as a MOSFET or an IGBT, utilizes an octagonal or inverse-octagonal deep trench super-junction in combination with an octagonal or inverse-octagonal gate trench. The octagonal and/or inverse-octagonal geometries form the patterns for creating charge compensation zones and gate zones. The octagonal and/or inverse-octagonal geometries are drawn with vertices at multiples of 45 degrees (45°, 90°, 135°, 180°, 225°, & 270°) and an internal angle of 135°, so that these geometries can fracture into rectangles and trapezoids without errors when creating masks, and so that these geometries expose {010}, {001} and {110} lattice planes and their equivalent silicon sidewall surfaces with known oxidation and epitaxial deposition characteristics. Selective epitaxial refill and gate oxidation during device processing result in an improved scalability. The device also achieves a field-effect device with improved packing density, improved current density, and improved on-resistance, while at the same time maintaining compatibility with the multiple-of-45°-angles of native photomask processing. In addition, by varying the length of each sidewall surface, devices with differing threshold voltages can be achieved without additional processing steps. In further addition, combining trenches with varying sidewall lengths allows for stress balancing during selective epitaxial refill.

In a first embodiment, the charge compensation zones (n-columns and p-columns which charge compensate each other) are formed by etching deep trenches using the octagonal or inverse-octagonal surface pattern into a semiconductor material having a first doping type (which may be an epitaxial semiconductor material for a MOSFET and some types of IGBT, and a non-epitaxial semiconductor material for other types of IGBTs), and then refilling the trenches with doped selective epitaxial material (SEG or selective epitaxial growth) of a second doping type to form the charge compensation regions.

Alternatively, in another embodiment, the sidewalls of the trenches may be implanted to dope them with a first doping type, and then refilled with doped selective epitaxial material of the second doping type to form the charge compensation regions.

Alternatively, in another embodiment, the sidewalls of the trenches may be implanted to dope them with a second doping type to form the charge compensation regions, after which the trenches may be refilled with an insulating material.

After the formation of the octagonal or inverse-octagonal charge compensation regions, gate trenches are etched into the silicon in an octagonal or inverse-octagonal pattern. An insulating layer is grown or deposited into the gate trenches, after which a gate electrode material such as polysilicon is deposited into the gate trenches to complete their formation.

BRIEF DESCRIPTION OF THE DRAWINGS

FIG. 1 also identifies some of the silicon sidewall planes which participate in the trench sidewalls.

DETAILED DESCRIPTION

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the invention and do not limit the scope of the invention.

In describing crystallographic lattice planes, the notation {hkl} is used which represents a family of equivalent lattice planes to the (hkl) lattice plane specified by the Miller indices h, k and l.

Figure 1:
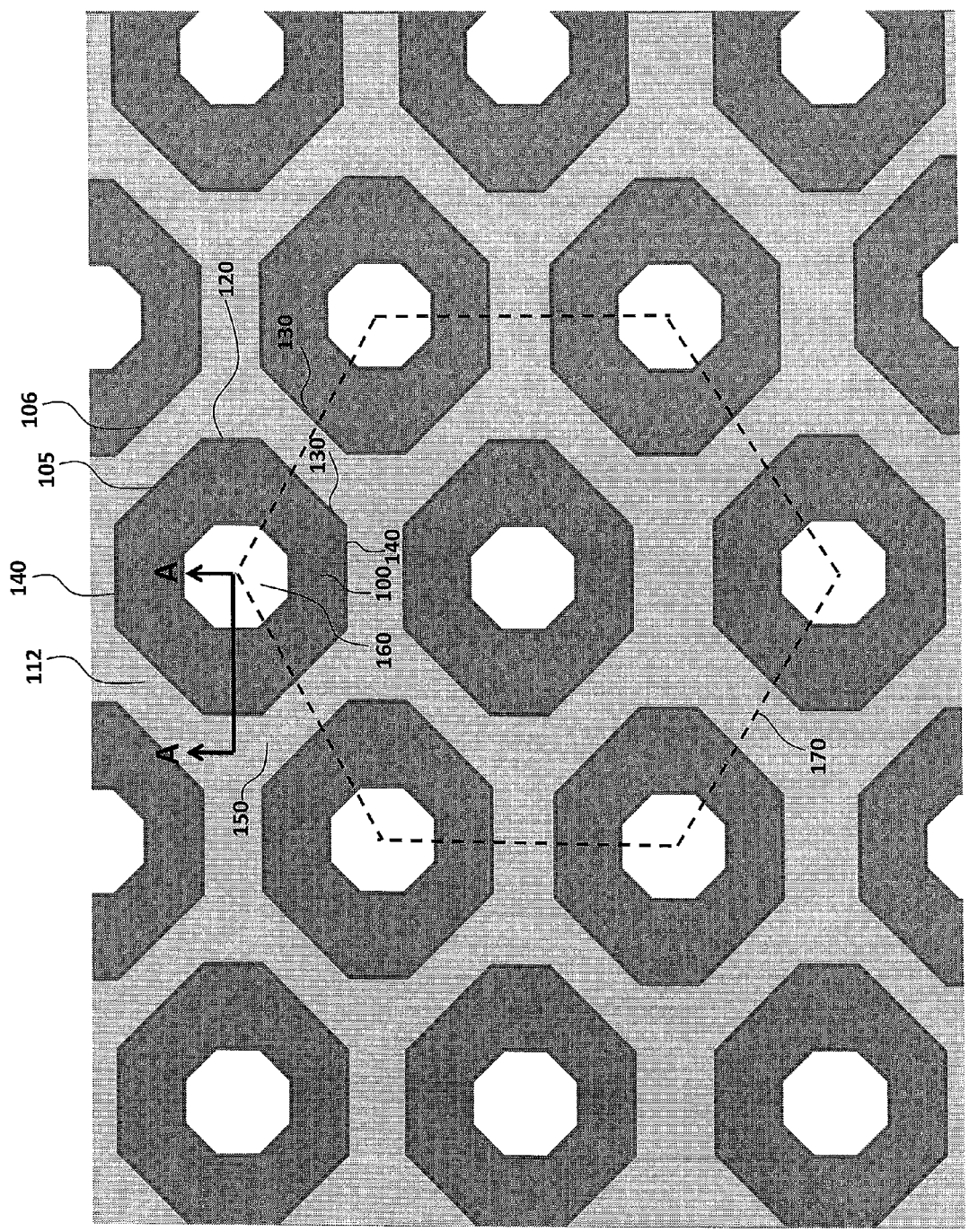
FIG. 1 illustrates a field-effect device layout which contains octagonal charge compensation trench zones and inverse-octagonal gate trench zones.

Referring to FIG. 1, a device layout for a set of super-junction field effect devices is shown. FIG. 1 is a top view of a portion of a silicon wafer layout illustrating the geometrical arrangement of the set of super-junction field-effect devices. Each field-effect device includes a gate zone 150 overlying a charge compensation zone. Gate zone 150 is bordered by gate trench sidewalls 105 and gate trench sidewalls 106. Gate zone 150 is an inverse-octagonal structure surrounding and above a charge compensation zone.

Underlying Si wafer zones 112 and 100 occupy all areas that are not deep trench zone 160. In use, groups of vertical field effect devices are generally metalized to operate in parallel as a single device.

The MOSFET field-effect devices are constructed on an epitaxial Si wafer with an n+ doped base substrate or on a non-epitaxial Si wafer with an n− doped substrate. IGBT field-effect devices are constructed on a non-epitaxial Si wafer with an n− doped substrate. The substrate of both devices is cut so that the top and bottom surfaces of the Si wafer are coplanar with equivalent {100} lattice planes. In a preferred embodiment, exterior trench sidewalls of the octagonal shaped areas defining gate zone 150 coincide with Si-crystallographic planes {001} lattice plane 140, {010} lattice plane 120 and {110} lattice plane 130.

The geometrical arrangement shown in FIG. 1 exhibits a hexagonal symmetry indicated by the hexagonal layout 170. In an alternate embodiment, a device layout can exhibit symmetries other than hexagonal symmetry or in addition to hexagonal symmetry.

The octagonal geometries are drawn having vertices at multiples of 45 degree angles (45°, 90°, 135°, 180°, 225°, & 270°) and an internal angle of 135°, maintaining compatibility with native photomask processing. When creating masks, octagonal geometries can fracture into rectangles and trapezoids defining the vertical field-effect devices without photomask gridding errors. The octagonal geometries expose the {010}, {001} and {110} lattice planes and their equivalent silicon sidewall surfaces with known oxidation and epitaxial deposition characteristics. In addition, by varying the lengths of the octagonal sidewall surfaces relative to each other, devices with differing threshold voltages can be achieved without additional processing steps. Further, forming and mixing trenches with varying sidewall lengths allows for stress balancing during selective epitaxial refill. The device achieves a field-effect with improved packing density, improved current density, and improved on-resistance.

On-resistance is the resistance of a semiconductor device when it is biased in the "on-state" by applying certain voltages and/or currents to its terminals. ("On-state" meaning that current flow from the device input to output terminals is enabled.) For a MOSFET, for example, on-resistance is often defined as drain current (Id) divided by drain voltage (Vd) when Vd is set to 0.1V and the gate voltage (Vg) is set to 10V.

Figure 2A:
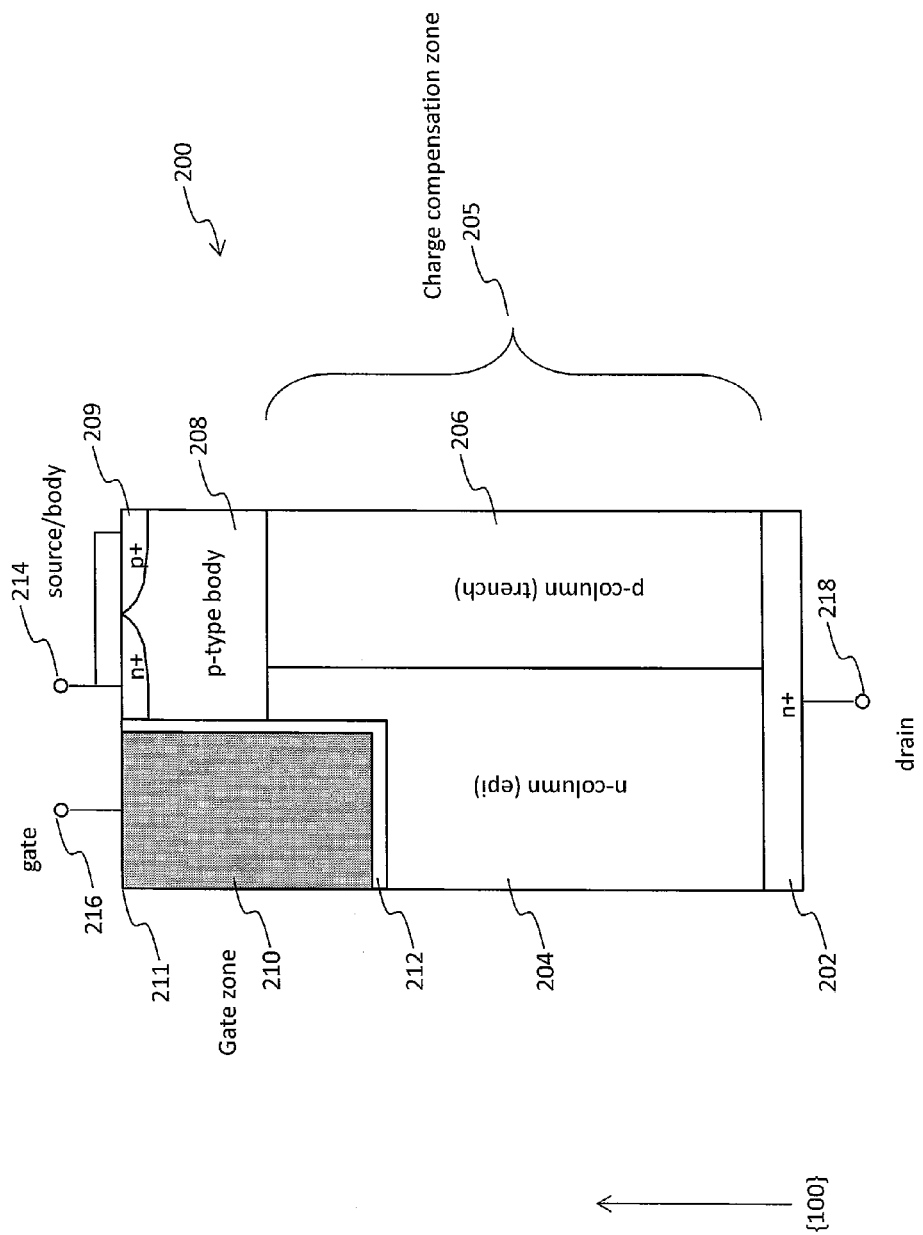
FIG. 2A illustrates a preferred embodiment of a field-effect device with an octagonal charge compensation region and an inverse octagonal gate trench, where the charge compensation region includes an n-type epitaxial column and a p-type trench column.

FIG. 2A shows a preferred embodiment of cross-section "AA" of FIG. 1. Vertical MOSFET field-effect device 200 comprises an n+ substrate 202 which is metalized on the bottom surface to form drain electrode 218. N+ substrate 202 is in contact with n-column 204 and p-column 206 which are adjacent one another and which together form charge compensation zone 205. N-column 204 and p-column 206 are in further contact with p-type body region 208.

An n+ source electrode 214 is adjacent p-type body region 208. P-type body region 208 includes p+ body-contacting electrode 209 which is electrically shorted to n+ source electrode 214 to avoid accidental excitation of a parasitic bipolar junction transistor which is formed between the n+ source electrode, p-type body region and the drain electrode.

Gate zone 210 is formed from an inverse-octagonal trench above n-column 204 and separated from n-column 204, p-column 206 and p-type body region 208 by a thin walled insulation oxide layer 212. Gate zone 210 is filled with gate electrode material adjacent oxide layer 212 and has a metallization layer 211 contacting the gate electrode material. Metallization layer 211 is in electrical contact with gate electrode 216.

In a preferred embodiment, oxide layer 212 is a silicon dioxide layer and gate electrode material is a polysilicon (polycrystalline Si) material.

Figure 2B:
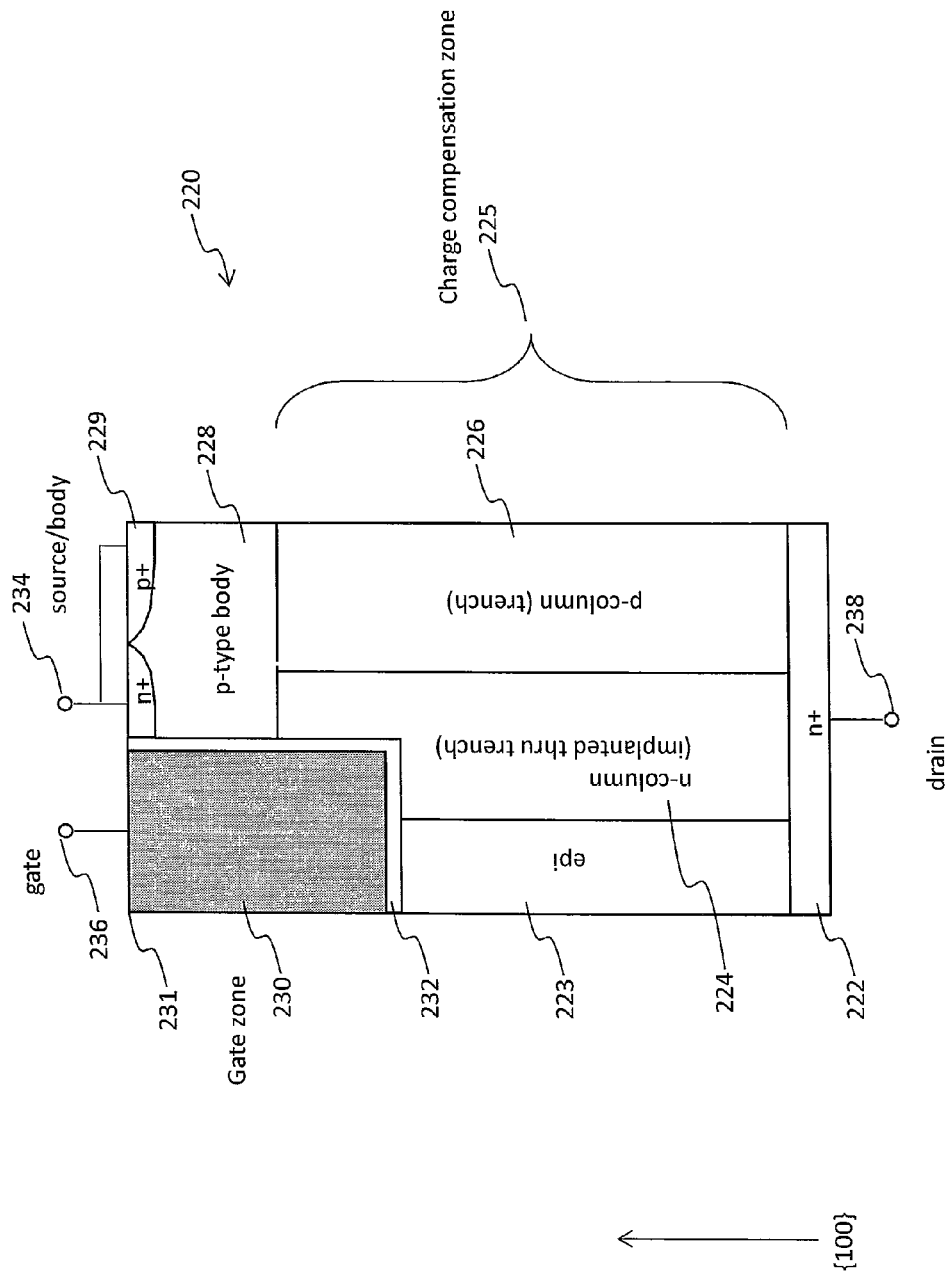
FIG. 2B illustrates a preferred embodiment of a field-effect device with an octagonal charge compensation region and an inverse octagonal gate trench, where the charge compensation region includes an epitaxial n-type material, an ion-implanted n-column and a p-type trench column.

Referring to FIG. 2B, a second embodiment of a vertical field effect device is disclosed. Vertical MOSFET field-effect device 220 comprises an n+ substrate 222 which is metalized on the bottom surface to form drain electrode 238. N+ substrate 222 is in contact with an n-type epitaxial layer 223, n-column layer 224 and p-column layer 226. N-type epitaxial layer 223 has a first doping (substantially intrinsic, and with a doping level of less than $5 \times 10^{13}$), n-column layer 224 is adjacent substantially intrinsic epitaxial layer 223 and has a second doping (with a doping level between $1 \times 10^{14}$ and $1 \times 10^{17}$) different than the first doping. P-column layer 226 is adjacent n-column layer 224 and has a third doping (p type, with a doping level between $1e^{14}$ and $1e^{17}$). N-type epitaxial layer 223, n-column layer 224 and p-column layer 226 together form charge compensation zone 225. N-column layer 224 and p-column 226 are in further contact with p-type body region 228.

An n+ source electrode 234 is adjacent p-type body region 228. P-type body region 228 includes p+ body-contacting electrode 229 which is electrically shorted to n+ source electrode 234 to avoid accidental excitation of a parasitic bipolar junction transistor which is formed between the n+ source electrode, p-type body region and the drain electrode.

Gate zone 230 is formed as an inverse-octagonal trench above first n-column epitaxial layer 223 and second n-column layer 224, with a thin walled insulation oxide layer 232 separating the gate electrode material from n-type epitaxial layer and the n-column. Gate zone 230 is filled with gate electrode material adjacent oxide layer 232 and has a metallization layer 231 contacting the gate electrode material. Metallization layer 231 is in electrical contact with gate electrode 236.

In a preferred embodiment, oxide layer 232 is a silicon dioxide layer and gate electrode material is a polysilicon (polycrystalline Si) material.

Figure 2C:
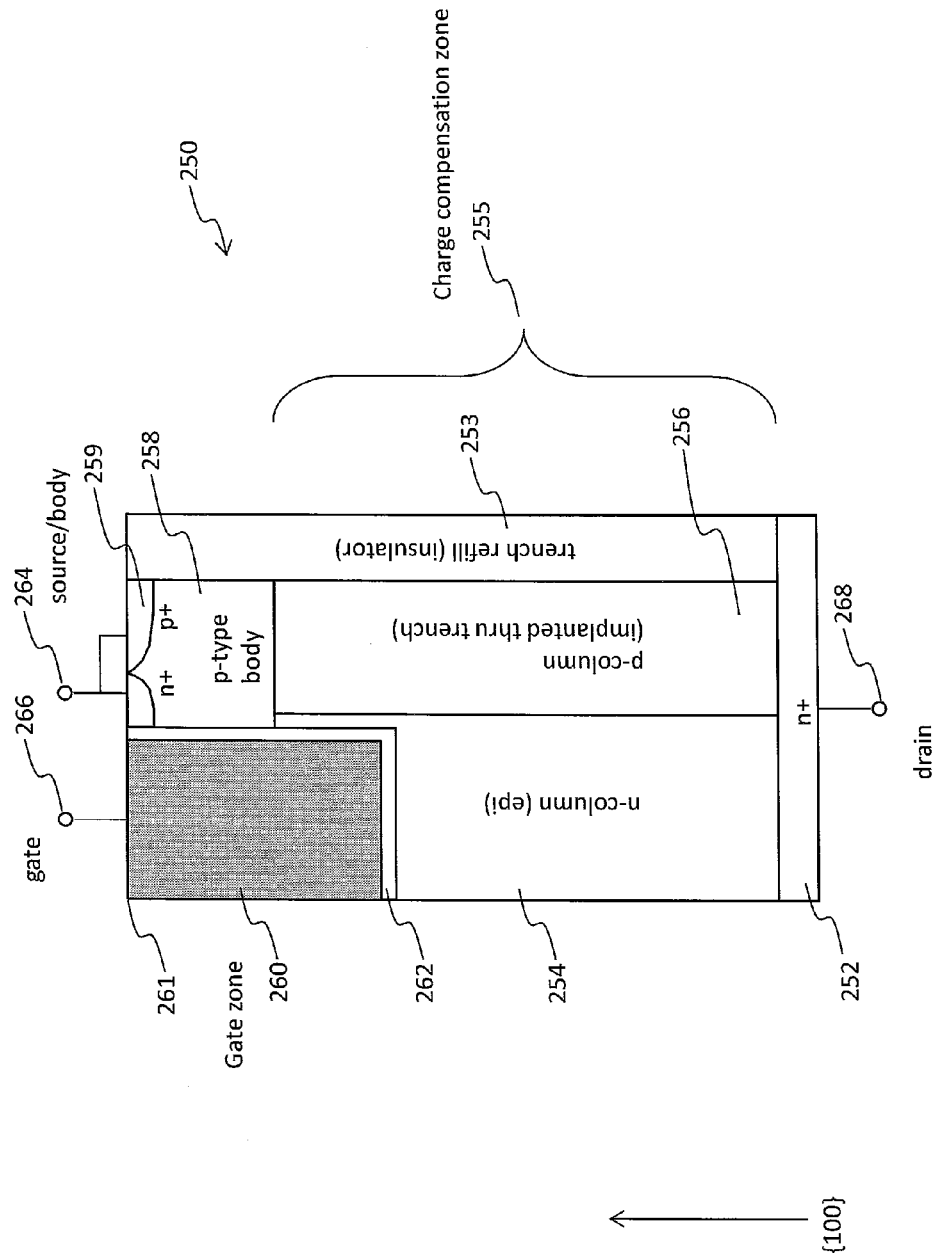
FIG. 2C illustrates a preferred embodiment of a field-effect device with an octagonal charge compensation region and an inverse octagonal gate trench, where the charge compensation region includes an n-type epitaxial column, an ion-implanted p-type column and an insulating trench refill.

Referring to FIG. 2C, a third embodiment of a vertical field effect device is disclosed. Vertical MOSFET field-effect device 250 comprises an n+ substrate 252 which is metalized on the bottom surface to form drain electrode 268 and is coplanar with the {100} lattice plane. N+ substrate 252 is in contact with n-column 254 and p-column 256 which are adjacent one another and which together form charge compensation zone 255. N-column 254 and p-column 256 are in further contact with insulation trench layer 253 and with p-type body region 258. An n+ source electrode 264 is adjacent p-type body region 258. P-type body region 258 includes p+ body-contacting electrode 259 which is electrically shorted to n+ source electrode 264 to avoid accidental excitation of a parasitic bipolar junction transistor which is formed between the n+ source electrode, p-type body region and the drain electrode.

Gate zone 260 is formed as an inverse-octagonal trench above n-column 254 separated from n-column 254 and p-type body region 258 by a thin walled insulation oxide layer 262. Gate zone 260 is filled with gate electrode material adjacent oxide layer 262 and has a metallization layer 261 contacting the gate electrode material. Metallization layer 261 is in electrical contact with gate electrode 266.

In a preferred embodiment, oxide layer 262 is a silicon dioxide layer and gate electrode material is a polysilicon (polycrystalline Si) material.

Figure 3A:
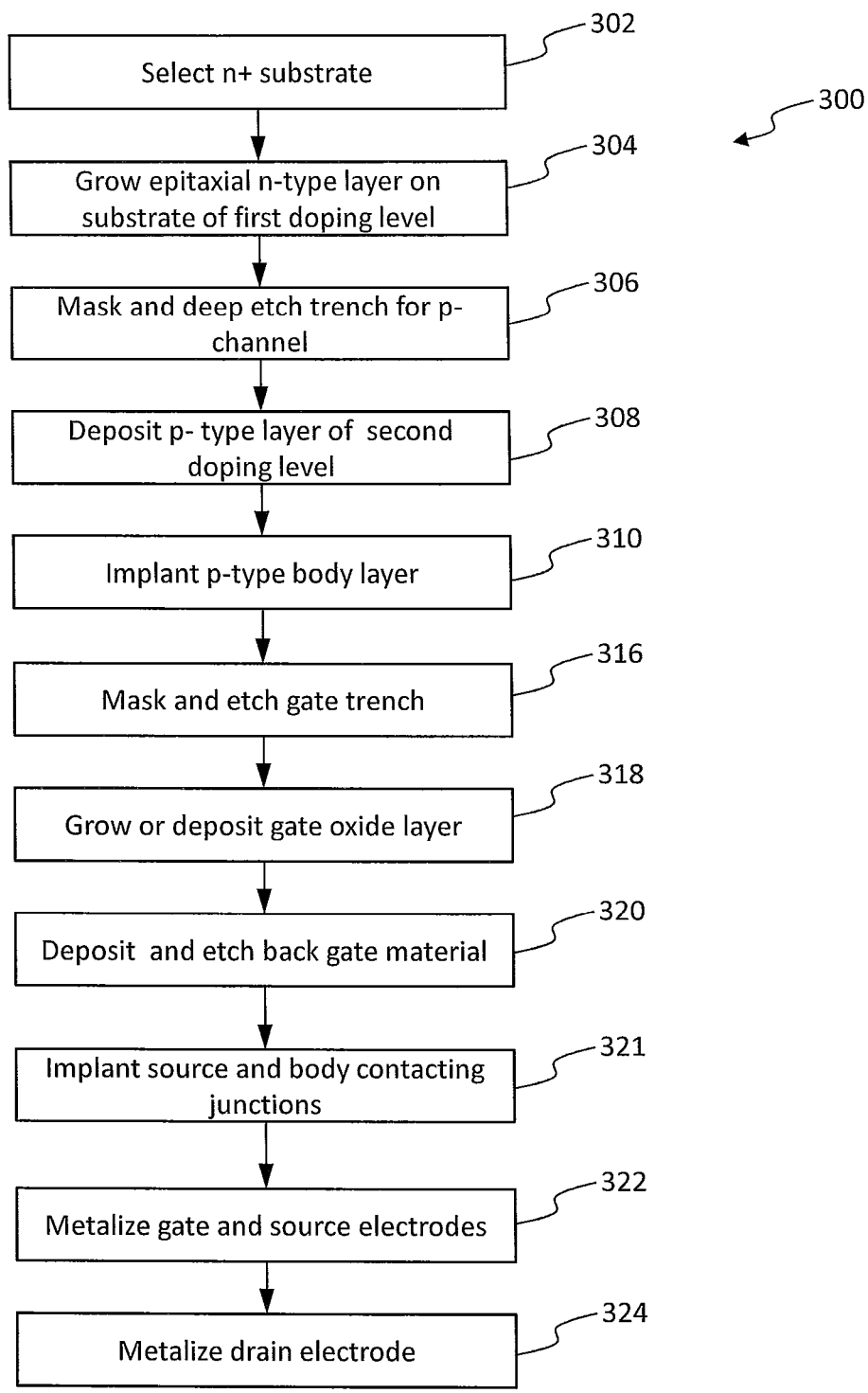
FIG. 3A is a flow chart of a preferred embodiment of a method for construction of a super-junction vertical field-effect device with octagonal geometry.

Referring to FIG. 3A a method 300 for construction of a set of super-junction MOSFET field-effect devices as in FIG. 2A is described. At step 302, the method begins by growing an n+ doped substrate oriented to be coplanar with the {100} lattice plane. At step 304, an n-type epitaxial layer of an n− material of a first doping level is epitaxially grown above the n+ doped substrate. At step 306, a suitable mask is applied and a deep octagonal trench is etched into the n-type epitaxial layer with the edges of the octagonal trench aligning with the {010}, {110} and {001} planes of the n+ doped substrate.

In a preferred embodiment, the bottom of the trench exposes the n+ substrate. In another embodiment, the bottom of the trench stops short of exposing the n+ substrate.

At step 308, a p-type epitaxial layer of a second doping level is deposited into the trench. At step 310, a p-type body layer of a third doping level is implanted into and above the n-type and p-type epitaxial layers. At step 316, a suitable mask is applied and an inverse octagonal gate trench is etched through the p-type body layer and into the n-type epitaxial layer. At step 318, a thin gate oxide layer is grown or deposited into the gate trench in contact with the n-type epitaxial layer, p-type body layer and n+ source region. At step 320, a gate material, such as polysilicon, is deposited into the gate trench in contact with the thin gate oxide layer and etched back to be substantially coplanar with the top surface. At step 321, a mask is applied and an n+ source junction is implanted, then another mask is applied and a p+ body-contacting junction is implanted. At step 322, a suitable mask is applied and metallization is deposited over the gate material and the n+ source junction to from the gate and source electrodes, respectively. At step 324, the bottom side of the n+ substrate is metalized to form the drain electrode.

Figure 3B:
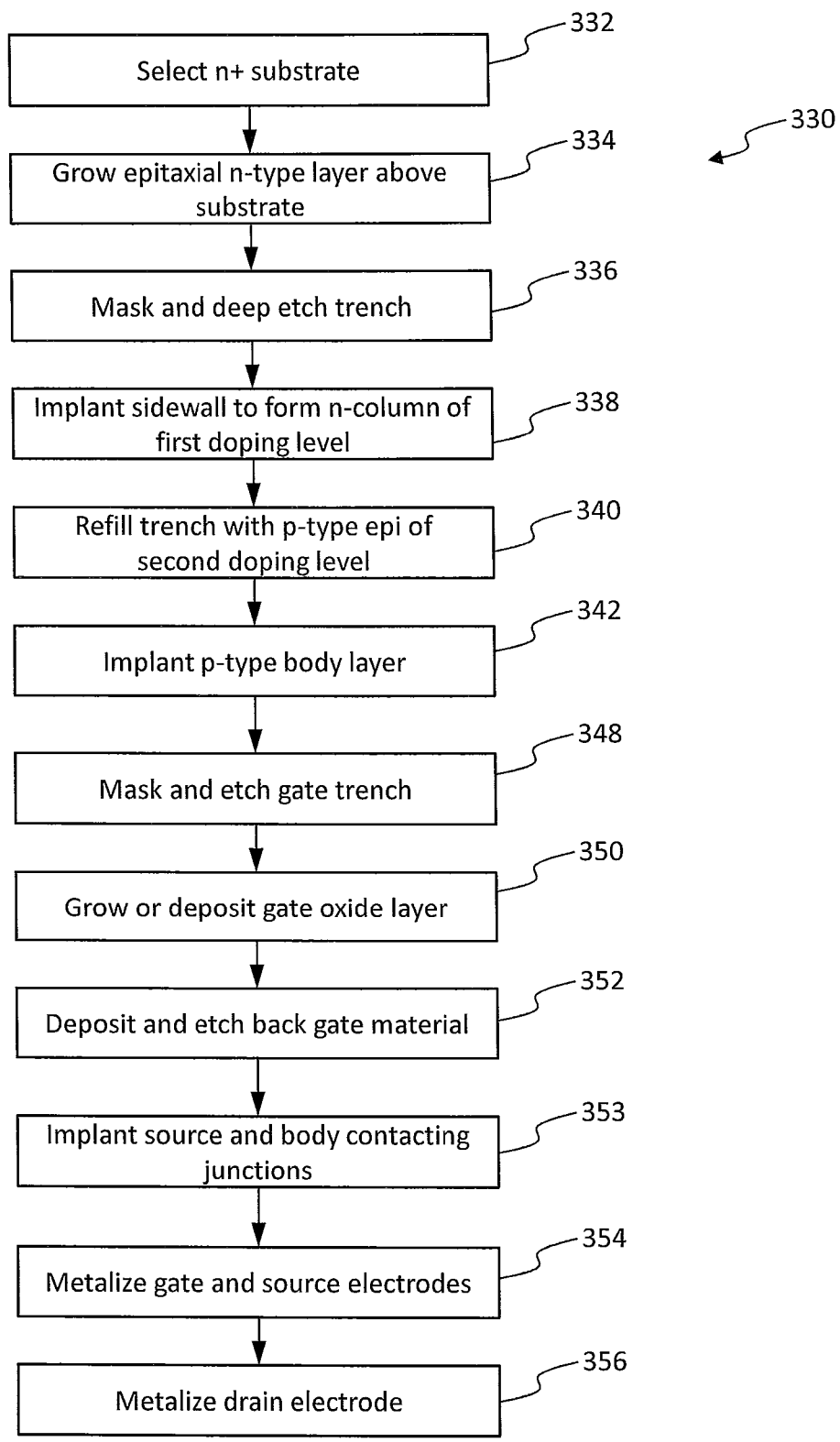
FIG. 3B is a flow chart of an alternate embodiment of a method for construction of a super-junction vertical field-effect device with octagonal geometry.

Referring to FIG. 3B a method 330 for construction of a set of super-junction MOSFET field-effect devices as in FIG. 2B is described. At step 332, the method begins by growing an n+ doped substrate oriented to be coplanar with the {100} lattice plane. At step 334, a substantially intrinsic n-type epitaxial layer is epitaxially grown on the n+ substrate. At step 336, a suitable mask is applied and an octagonal trench is etched from the n-type epitaxial layer where the sidewalls of the octagonal trench align with the {001}, {010} and {110} lattice planes of the n+ substrate.

In a preferred embodiment, the bottom of the trench exposes the n+ substrate. In another embodiment, the bottom of the trench stops short of exposing the n+ substrate.

At step 338, the sidewalls of the octagonal trench are implanted using ion implantation to form an n-column layer of a first doping level. At step 340, a p-column layer of a second doping level is deposited into the octagonal trench to contact the n-column layer and to refill the trench. In a preferred embodiment, the p-column layer is a p-type epitaxial material. At step 342, a p-type body layer of third doping level is implanted into and above the substantially intrinsic n-type epitaxial layer, n-column layer and p-column layer. At step 348, another mask is applied and a gate trench is etched through the p-type body layer and into the n-column and p-column layers. At step 350, a thin gate oxide layer is grown or deposited into the gate trench in contact with the n-column layer, p-type body layer and n+ source region. At step 352, a gate material, such as polysilicon, is deposited into the gate trench in contact with the thin gate oxide layer and etched back to be substantially co-planar with the top surface. At step 353, a mask is applied and an n+ source junction is implanted, then another mask is applied and a p+ body-contacting junction is implanted. At step 354, a suitable mask is applied and metallization is deposited over the gate material and the n+ source junction to from the gate and source electrodes, respectively. At step 356, the bottom side of the n+ substrate is metalized to form the drain electrode.

Figure 3C:
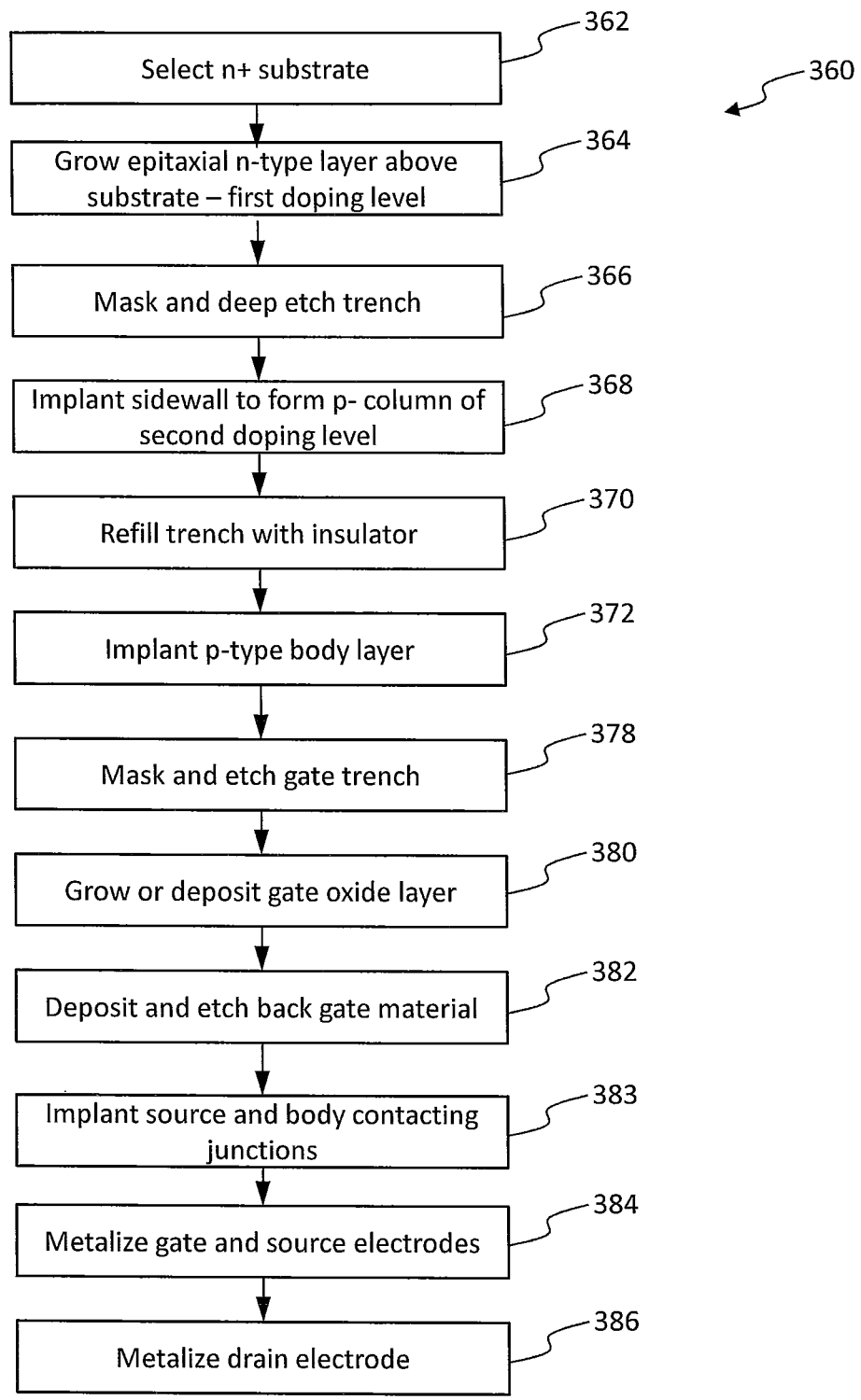
FIG. 3C is a flow chart of an alternate embodiment of a method for construction of a super junction vertical field-effect device with octagonal geometry.

Referring to FIG. 3C a method 360 for construction of a set of super-junction MOSFET field-effect devices as in FIG. 2C is described. At step 362, the method begins by growing an n+ doped substrate oriented to be coplanar with a {100} lattice plane. At step 364, an n-type epitaxial layer of an n− material of a first doping level is epitaxially grown above the n+ doped substrate. At step 366, a suitable mask is applied and a deep octagonal trench is etched into the n-type epitaxial layer with the edges of the octagonal trench aligning with the {010}, {110} and {001} lattice planes of the n+ substrate.

In a preferred embodiment, the bottom of the trench exposes the n+ substrate. In an another embodiment, the bottom of the trench stops short of exposing the n+ substrate.

At step 368, a p-column layer of a second doping level is implanted into the sidewalls adjacent the n-type epitaxial layer of the octagonal trench. At step 370, the octagonal trench is refilled with an insulating material, such as $SiO_2$, to form an insulator layer which is in contact with the p-column layer. At step 372, a p-type body layer of third doping level is implanted into and above the n-type epitaxial layer and p-column layer, adjacent the insulator layer. At step 378, a mask is applied and a gate trench is etched through the p-type body layer and into the n-type epitaxial layer. At step 380, a thin gate oxide layer is grown or deposited into the gate trench in contact with the n-type epitaxial layer and p-type body layer. At step 382, a gate material, such as polysilicon, is deposited into the gate trench in contact with the thin gate oxide layer and etched back to substantially co-planar with the top surface. At step 383, a mask is applied and an n+ source junction is implanted, then another mask is applied and a p+ body-contacting junction is implanted. At step 384, a suitable mask is applied and metallization is deposited over the gate material and the n+ source junction to from the gate and source electrodes, respectively. At step 386, the bottom side of the n+ substrate is metalized to form the drain electrode.

The embodiments presented in this disclosure are intended to provide implementable examples of the present invention, but are not intended to limit the present invention. For example, other materials besides Si can be used as a base semiconductor material. Various ranges of doping levels for the n+ regions, n-columns, p-columns and p-type body can be employed as required.

The invention claimed is:

1. A vertical field effect device comprising:
a semiconductor substrate, having a drain electrode;
a charge compensation zone, adjacent the semiconductor substrate, having a first set of sidewall surfaces, connected in a first octagonal geometry;
the first octagonal geometry having a first set of vertices;
a first surface metalized with a gate electrode and a source electrode;
a source region, in contact with the source electrode and the first surface;

a body region in contact with a p+ body contact region, adjacent the source region and the charge compensation zone;

a gate zone, in contact with the gate electrode, adjacent the charge compensation zone;

the source region, the body region, and the first surface having a second set of sidewall surfaces connected in a second octagonal geometry;

the second octagonal geometry having a second set of vertices;

the first set of vertices having a first multiple of 45 degrees; and, the second set of vertices having a second multiple of 45 degrees.

2. The vertical field effect device of claim 1, wherein the source region and the p+ body contact region further comprise:

a third set of sidewall surfaces connected in a third octagonal geometry;

the third set of sidewall surfaces having a third set of vertices; and, the third set of vertices having a third multiple of 45 degrees.

3. The vertical field effect device of claim 1, wherein the gate zone further comprises:

a gate oxide layer, adjacent the charge compensation zone; and, a gate electrode material, adjacent the gate oxide layer and the first surface.

4. The vertical field effect device of claim 3:

wherein the charge compensation zone further comprises an n-column region and a p-column region;

wherein the source region further comprises a p-type body, and an n+ source region adjacent the p-type body;

wherein the semiconductor substrate further comprises an n+ drain region adjacent the second surface; and, wherein the gate oxide layer is adjacent the n-column region, the p-type body material and the n+ source region.

5. The vertical field effect device of claim 1, wherein the charge compensation zone further comprises:

an n-type epitaxial region;

a trench in the n-type epitaxial region; and, a p-column region in the trench.

6. The vertical field effect device of claim 1, wherein the charge compensation zone further comprises:

an epitaxial region;

a trench, in the epitaxial region, having a trench sidewall surface;

an n-column region adjacent the trench sidewall surface;

a p-column region, in the trench, adjacent the n-column region.

7. The vertical field effect device of claim 1, wherein the charge compensation zone further comprises:

an epitaxial region;

a trench, in the epitaxial region, having a trench sidewall surface; and, a p-column region adjacent the trench sidewall surface.

8. The vertical field effect device of claim 7 further comprising an insulator column, in the trench, adjacent the p-column region and the source region.

9. The vertical field effect device of claim 1, further comprising a device layout exhibiting hexagonal symmetry.

10. The vertical field effect device of claim 1, wherein a chosen sidewall surface, of the group of the first set of sidewall surfaces and the second set of sidewall surfaces, is coplanar with a {110} lattice plane of the semiconductor substrate.

11. The vertical field effect device of claim 1, wherein at least one sidewall surface, of the first set of sidewall surfaces and the second set of sidewall surfaces, is coplanar with a {010} lattice plane of the semiconductor substrate.

12. The vertical field effect device of claim 1, wherein at least one sidewall surface, of the first set of sidewall surfaces and the second set of sidewall surfaces, is coplanar with an equivalent lattice plane of a {001} lattice plane of the semiconductor substrate.

13. The vertical field effect device of claim 1, further comprising a chosen sidewall surface, of the group of the first set of sidewall surfaces and the second set of sidewall surfaces, having a length that is related to a prescribed composite threshold voltage.

14. The vertical field effect device of claim 1, further comprising a chosen sidewall surface, of the group of the first set of sidewall surfaces and the second set of sidewall surfaces, having a length that is related to a prescribed composite level of material stress in the charge compensation zone.

* * * * *